Dec. 15, 1964 D. R. HOLCOMB 3,161,816
PARAMETRIC EVEN HARMONIC FREQUENCY MULTIPLIER
Filed Feb. 29, 1960
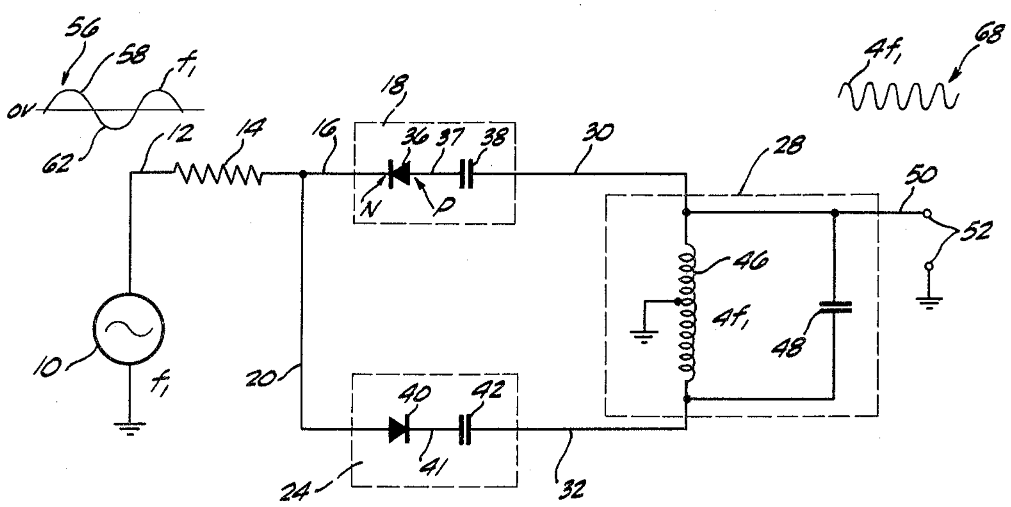
INVENTOR
DON R. HOLCOMB,
BY
Walter J. Adam
ATTORNEY.

United States Patent Office 3,161,816
Patented Dec. 15, 1964

3,161,816
PARAMETRIC EVEN HARMONIC FREQUENCY MULTIPLIER

Don R. Holcomb, Los Angeles, Calif., assignor to Hughes Aircraft Company, Culver City, Calif., a corporation of Delaware
Filed Feb. 29, 1960, Ser. No. 11,667
4 Claims. (Cl. 321—69)

This invention relates to harmonic generators and particularly to an improved parametric frequency multiplier for developing signals at a desired even harmonic frequency of an input signal.

There are many uses for a simplified and efficient harmonic generator such as to provide a power source for very high frequency signals in a radar transmitter. Klystron devices which are presently used to provide transmitted signals at very high radar frequencies have the disadvantages of developing signals at a low power level and of having a very short operating life. A simple and efficient frequency multiplier that multiplies the signal from a klystron operating at a relatively low frequency with a high power level to a signal at a high frequency with a high power level would be very advantageous to the art.

In the prior art, some frequency multipliers or harmonic generators utilize the nonlinear resistance characteristics of conventional diodes driven by a signal generator, but have a low conversion efficiency. Other harmonic generators utilize a single element having nonlinear capacitance characteristics to develop signals of odd harmonic frequencies from which one frequency is then selected by a filter. Because both even and odd harmonic signals are developed by this arrangement, a relatively narrow band filter is required which is complicated and expensive to build. Other harmonic generators for developing odd harmonic signals utilize a driving source, two diodes connected anode to anode or cathode to cathode in series, the diodes having nonlinear characteristics and driven by the driving source, and a tank or filter circuit to present a high impedance to current signals at a desired odd harmonic frequency. Because the series diodes develop signals at only odd harmonic frequencies of the driving source signal, a filter with a relatively wide band may be utilized. However, this series arrangement has the disadvantages that only odd harmonic signals are developed and that a relatively large capacitance value is required, which may be larger than available from two series connected diodes or that may require physically large diodes. Other harmonic generator systems have been utilized that develop only odd harmonic frequencies of the input signal by providing a first series connected diode and capacitor coupled in parallel with a second series connected diode and capacitor, the diodes having nonlinear capacitive characteristics. The first diode and capacitor and the second diode and capacitor are arranged so that the even harmonics are cancelled and only the odd harmonics are generated to be applied to a filter for selecting the desired odd harmonic signal. Because the capacitance is arranged in parallel, diodes having a smaller capacitance value may be utilized.

However, there are many uses where a simplified and efficient circuit is required that develops signals at even harmonic frequencies of the frequency of the input signal. For example, in radar it may be desirable to transmit at a frequency that is an even harmonic multiple of available klystron devices. Also, in some types of radar systems where it is desired to provide selection of a plurality of frequencies to be transmitted, a separate even and an odd harmonic generator may be utilized to provide a greater selection of frequencies with a relatively simple servo system for isolating the one selected frequency.

It is, therefore, an object of this invention to provide a parametric type harmonic generator that utilizes elements having a minimum of size and complexity.

It is another object of this invention to provide a frequency multiplier that develops a selected signal from a large capacitance variation while utilizing diodes having a relatively small capacitance value.

It is a further object of this invention to provide a frequency multiplier that responds to a source of input signals to develop signals that are at even harmonic frequencies of the input signal.

It is a still further object of this invention to provide a highly efficient generator of even harmonic signals of an input signal utilizing diodes having nonlinear capacitance characteristic for channelling the odd harmonics and including means to select a desired even harmonic frequency as the output signal.

Briefly, one form of the harmonic generator in accordance with this invention includes a first variable reactance circuit comprising a diode having nonlinear capacitance characteristics with an anode connected in series with a capacitor and a second reactance circuit comprising a diode having nonlinear capacitance characteristics with a cathode connected in series with another capacitor. The cathode of one diode and the anode of the other diode are connected to a signal supplying a driving signal of a fundamental frequency. The capacitors of the first and second reactance circuits are connected across a resonant circuit in a push pull arrangement, that is an arrangement in which signals applied thereto in phase with each other are cancelled and signals applied out of phase with each other are combined. The resonant circuit is tuned to a desired even harmonic of the fundamental frequency. In response to the input signal, the odd harmonic signals developed by the two reactance elements are in phase with other and cancel in the tuned circuit while the even harmonic signals are 180 degrees out of phase from each other and are combined in the tuned circuit. The resonant circuit presents a high impedance to current signals developed by the capacitance variation that are at the selected even harmonic frequency so as to develop even harmonic output signals only at this selected frequency. As the impedance of the tank circuit is extremely low to even harmonic signals at frequencies other than the selected frequency, the generator has a relatively high efficiency. Because the odd harmonics are cancelled by the parallel arrangement of the diodes, a tank circuit may be utilized that has a relatively wide frequency band.

The novel features of this invention both as to its organization and method of operation will best be understood from the accompanying description, taken in connection with the accompanying drawing, which is a schematic circuit diagram of the even harmonic generator of this invention.

Referring first to the drawing which shows a circuit diagram of the even harmonic generator in accordance with this invention, the general arrangement of the elements therein will be explained. A sine wave generator 10 is provided with one terminal referenced to ground potential, for example. A signal lead 12 couples the input signal from the generator 10 to one end of resistor 14, which represents the inherent source resistance of the generator 10. The input signal is applied through the resistor 14 and through a lead 16 to a first reactance element 18 and in parallel through a lead 20 to a second reactance element 24. The first and second reactance elements 18 and 24 are coupled to a tank circuit 28 through respective leads 30 and 32. The first reactance element 18 includes a diode 36 having its cathode coupled to the lead 16 and its anode coupled through a lead 37 to one plate of a D.C. (direct current) blocking capacitor 38, which in turn has its other plate coupled to the lead 30. The second reactance element 24 includes a diode 40 having its anode coupled to a lead 20 and its cathode coupled through a lead 41 to one plate of a D.C. blocking capacitor 42, which in turn has its other plate coupled to the lead 32. The diodes 36 and 40 are of the type having voltage variable nonlinear capacitance characteristics. Odd and even harmonic current signals developed in the reactance elements 18 and 24 are applied through the leads 30 and 32 to opposite ends of an inductor 46, which in turns is coupled in parallel with a capacitor 48 to form a parallel resonant, or tank, circuit 28. The inductor 46 is grounded at a center tap so as to provide a push pull arrangement to signals on the leads 30 and 32. The odd harmonic current signals developed in the reactance elements 18 and 24 are in phase with each other so as to cancel in the push pull arrangement of the tank circuit 28. The even harmonic current signals are 180 degrees out of phase from each other to add in the tuned circuit 28. An output lead 50 is coupled to one end of the inductor 46 and capacitor 48 for applying an output signal at the desired even harmonic frequency to an output terminal 52. The tank circuit 28 is tuned to present a high impedance to current components at a frequency that is a desired even harmonic of a frequency $f_1$ of the signal developed by the generator 10, thus developing output signals at the selected even harmonic frequency. It is to be noted that the tank circuit 28 may also have a series resonant circuit, as well known in the art.

The diodes 36 and 40 are semiconductor diodes with a capacitance that is varied by a variation of the voltage applied thereto. As is well known, diodes of this type consist of a $p$ zone having an abundance of positive carriers corresponding to the anode end, an $n$ end zone having an abundance of negative carriers corresponding to the cathode end, and a depletion zone in between the other two zones having relatively few carriers therein. The $p$ and $n$ zones are indicated in the figure for the diode 36. When a potential is applied so that one of these diodes is positive at the anode and negative at the cathode, the diode is forward biased and carriers act to bridge the depletion zone to form a conducting path through the diode. When the applied potential is reversed from this forward biased condition the diode is back biased and the depletion zone reappears and isolates the two zones of the diodes from each other. It is primarily in this back biased condition that the diodes act as a variable capacitance element. A back bias applied across the diode causes the carriers to be pulled away from the depletion zone. The greater the potential applied in a back biased direction across the diode, the further the carriers are pulled away from the depletion zone and the lower is the capacitance value of the diode. Also, the static characteristics of the diodes are such that they act as a capacitance for a very small voltage range in the forward biased condition. The diodes utilized in this invention may be "varicap" silicon junction diodes manufactured by Pacific Semiconductiors, Inc., Culver City, California.

The operation of the harmonic generator will now be further explained. The sine wave generator 10 develops a signal as shown by a waveform 56 that oscillates above and below a reference level which is shown as zero volts. The signal of the waveform 56 which is at a fundamental frequency $f_1$ is continually applied to the reactance circuits 18 and 24. In response to the signal of the waveform 56 each reactance element 18 and 24 develops a capacitance variation which in turn develops current signals on the leads 30 and 32. The current signals are at harmonic frequencies of the driving signal of the waveform 56 with the odd harmonics developed in each reactance element being in phase with each other. Also, the current signals that are even harmonics of the frequency $f_1$ are developed 180 degrees out of phase with each other on the leads 30 and 32 so as to be combined in the tank circuit 28.

When a positive alternation 58 is impressed on the reactance elements 18 and 24, the diode 36 is reverse biased with a large potential difference thereacross and develops a small capacitance value. At the same time the diode 40 is reverse biased with only a small potential difference across the diode and develops a relatively large capacitance value. This reverse biased condition of the diode 40 results from the bias maintained on the lead 41 as determined by the charge distribution between the blocking capacitor 42 and the diode 40. Thus, as the alternation 58 rises in potential the diode 36 has a relatively small decrease of capacitance value and the diode 40 has a relatively large increase of capacitance value. In response to the fall of potential of the alternation 58, the diode 36 has a relatively small increase of capacitance value and the diode 40 has a relatively large decrease of capacitance value.

When a negative alternation 62 is impressed on the reactance elements 18 and 24, the diode 36 is reverse biased with a small potential difference relative to the bias maintained on the lead 37 and develops a large increase of capacitance value. At the same time, the diode 40 is reverse biased with a large potential difference and develops a small decrease of capacitance value. As the alternation 62 rises in potential value, the diode 36 has a relatively large decrease of capacitance value and the diode 40 has a relatively small increase of capacitance value. Thus, in response to the fundamental signal of the waveform 56 the diodes 36 and 40 develop a similar capacitance versus voltage variation, displaced 180 degrees in phase from each other.

In response to the capacitance variation, the diodes 36 and 40 develop voltage components thereacross as well as current components on the leads 37 and 41. Voltage and current components are developed for all of the odd and even harmonics of the frequency $f_1$ of the driving signal of the waveform 56. To consider only the current components, the odd harmonic components including the fundamental component developed in the reactance element 18 are in phase and equal in amplitude from those developed in the reactance element 24, thus cancelling in the push pull arrangement of the tank circuit 28 after passing through the D.C. blocking capacitors 38 and 42. The even harmonic current components developed in the reactance element 18 are 180 degrees out of phase and equal in amplitude with the even harmonic components developed in the reactance element 24, and after passing through the D.C. blocking capacitors 38 and 42 add or combine in the tank circuit 28. Thus, because of the cancelling of the odd harmonic signals only the even harmonic signals remain in the tank circuit 28.

The tank circuit 28 is tuned to store energy at a desired even harmonic frequency such as $4f_1$, thus presenting a high impedance to the current components at this frequency. Current components at all other frequencies are cancelled or effectively short circuited by passing through the low impedance of the tank circuit 28 to ground potential at the center tap of the inductor 46. Because of the high impedance of the tank circuit to the selected frequency $4f_1$, the current components at this selected frequency in the tank circuit 28 develop an output voltage signal on the lead 50 as shown by a waveform 68. It is to be again noted that the tank circuit 28 may be tuned to any desired even harmonic frequency to develop output voltage signals on the lead 50 at that frequency.

Because the odd harmonic signals are cancelled, the tank circuit 28 may be designed with a relatively wide frequency band. For satisfactory operation at a relatively high frequency of the driving signals of the waveform 56, it has been found difficult to design tank circuits with a sufficiently narrow band to only present a high impedance to current signals of the selected even harmonic frequency with odd harmonic current signals present. Thus, because the odd harmonic signals are cancelled the even harmonic generator of this invention may be utilized with a simplified tank circuit that has a minimum of components. Another advantage of the circuit in accordance with this invention is that none of the high frequency components developed by the circuit are present at the source or on the lead 16.

An arrangement which may be utilized with the harmonic generator in accordance with this invention is to include circuits to form fixed biased voltages across the diodes 36 and 40. These bias voltages allow the use of diodes that are not perfectly matched in capacitance characteristics while still reliably cancelling the even harmonics. Also biased circuits may be required when a number of harmonic generators are connected in series so as to initially start operation with desired operating potential. Further, any effects of variations in the amplitude of the driving signal of the waveform 56 are minimized by utilizing fixed biases across the diodes as well as the self bias developed across the diodes. It is to be noted that the circuit in accordance with this invention may utilize a microwave resonator as the capacitor and inductors with a magnetic inductive coupling for receiving the even harmonic output signal.

Thus, there has been described a simplified and highly efficient harmonic generator circuit that develops fourth harmonic signals of the driving signal or any desired even harmonic signal as determined by the frequency at which the tank circuit is tuned. Because of the parallel arrangement of the reactance elements, the odd harmonic current signals are cancelled, thus greatly simplifying design of the tank circuit. This circuit has an advantage that the reactance elements are connected in parallel allowing a high impedance variation to be obtained with diodes having relatively small capacitance values. Because all harmonic signals, except the selected harmonic signals, are shorted out or grounded in the tank circuit, this circuit operates with a relatively high efficiency.

What is claimed is:

1. A frequency multiplier circuit comprising: a signal generator for providing a driving signal at a fundamental frequency, first variable reactance means having a non-linear reactance vs. voltage characteristic coupled to said generator for developing current signals at even and odd harmonic frequencies of said fundamental frequency, second variable reactance means having a non-linear reactance vs. voltage characteristic coupled to said generator for developing current signals at even and odd harmonic frequencies of said fundamental frequency, with the odd harmonic signals developed by said first and second reactance means being in phase with each other and the even harmonic signals developed by said first and second reactance means being 180° out of phase with each other, means for maintaining both said first and second reactance means non-conductive of direct current during the entire cycle of said driving signal, and tank circuit means resonant at a preselected even harmonic frequency of said fundamental frequency for developing output signals at said preselected frequency, said tank circuit means including means for canceling the odd harmonic signals and combining the even harmonic signals developed by said first and second reactance means.

2. A frequency multiplier circuit comprising: a signal generator for providing a driving signal at a fundamental frequency, first variable capacitance means including a first semiconductor diode having a non-linear capacitance vs. voltage characteristic coupled to said generator for developing current signals at even and odd harmonic frequencies of said fundamental frequency, second variable capacitance means including a second semiconductor diode having a non-linear capacitance vs. voltage characteristic like that of said first diode coupled to said generator in opposite polarity from said first diode for developing current signals at even and odd harmonic frequencies of said fundamental frequency, with the odd harmonic signals developed by said first and second capacitance means being in phase with each other and the even harmonic signals developed by said first and second capacitance means being 180° out of phase with each other, means for maintaining both said first and second semiconductor diodes reverse biased during the entire cycle of said driving signal, and tank circuit means resonant at a preselected even harmonic frequency of said fundamental frequency for developing output signals at said preselected frequency, said tank circuit means including means for canceling the odd harmonic signals and combining the even harmonic signals developed by said first and second capacitance means.

3. A harmonic generator circuit for developing a desired even harmonic of a predetermined frequency comprising: a source of alternating signals at said predetermined frequency, said source being referenced to a fixed potential, variable reactance means maintained non-conductive of direct current during the entire cycle of said alternating signals for developing current signals at even and odd harmonic frequencies of said predetermined frequency, said variable reactance means comprising first and second alternating current paths, each having one end coupled to said alternating signal source and each having a non-linear reactance vs. voltage characteristic, with the odd harmonic signals developed in said first path being in phase with the odd harmonic signals developed in said second path and the even harmonic signals developed in said first path being 180° out of phase with the even harmonic signals developed in said second path, a resonant circuit including an inductor and a capacitor coupled in parallel between the ends of said first and second alternating current paths remote from said signal source, said inductor having a center tap coupled to said fixed potential whereby said harmonic signals developed in said first and second alternating current paths combine in said inductor in phase opposition, and said resonant circuit being tuned to said desired even harmonic frequency.

4. A harmonic generator circuit for developing a desired even harmonic of a predetermined frequency comprising: a source of alternating signals at said predetermined frequency, variable capacitance means maintained non-conductive of direct current during the entire cycle of said alternating signals for developing current signals at even and odd harmonic frequencies of said predetermined frequency, said variable capacitance means comprising first and second alternating current paths, said first alternating current path including a first fixed capacitor and a first semiconductor diode having a non-linear capacitance vs. voltage characteristic connected in series, with the anode of said first diode connected to said fixed capacitor and the cathode of said first diode connected to said alternating signal source, said second alternating current path including a second fixed capacitor and a second semiconductor diode having a non-linear capacitance vs. voltage characteristic connected in series, with the cathode of said second diode connected to said second capacitor and the anode of said second diode connected to said alternating signal source, whereby the odd harmonic signals developed in said first path are in phase with the odd harmonic signals developed in said second path and the even harmonic signals developed in said first path are 180° out of phase with the even harmonic signals developed in said second path, and tank circuit means resonant at said desired even harmonic frequency of said predetermined frequency coupled to the ends of said alternating current paths remote from said alternating signal source for developing output signals at said desired frequency, said tank circuit means including means for canceling the odd harmonic signals and combining the even harmonic signals developed in said first and second alternating current paths.

References Cited in the file of this patent

UNITED STATES PATENTS

| | | |
|---|---|---|
| 2,440,465 | Ferguson | Apr. 27, 1948 |
| 2,748,280 | Nelson et al. | May 29, 1956 |
| 2,777,066 | Brockman | Jan. 8, 1957 |
| 2,904,685 | Salmet | Sept. 15, 1959 |
| 2,946,963 | Lee | July 26, 1960 |

FOREIGN PATENTS

| | | |
|---|---|---|
| 604,246 | Great Britain | June 30, 1948 |
| 560,292 | Italy | Apr. 22, 1957 |
| 809,506 | Great Britain | Feb. 25, 1959 |

UNITED STATES PATENT OFFICE
CERTIFICATE OF CORRECTION

Patent No. 3,161,816 December 15, 1964

Don R. Holcomb

It is hereby certified that error appears in the above numbered patent requiring correction and that the said Letters Patent should read as corrected below.

Column 2, line 22, for "characteristic for channelling" read -- characteristics for canelling --; line 42, after "with" insert -- each --; column 3, line 24, for "turns" read -- turn --.

Signed and sealed this 4th day of May 1965.

(SEAL)
Attest:

ERNEST W. SWIDER
Attesting Officer

EDWARD J. BRENNER
Commissioner of Patents